United States Patent
Banerjee et al.

(10) Patent No.: US 11,574,884 B2
(45) Date of Patent: Feb. 7, 2023

(54) MULTI-FUNCTION BOND PAD

(71) Applicant: Texas Instruments Incorporated, Dallas, TX (US)

(72) Inventors: Suvadip Banerjee, Horamavu (IN); John Paul Tellkamp, Rockwall, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/162,189

(22) Filed: Jan. 29, 2021

(65) Prior Publication Data
US 2022/0246566 A1 Aug. 4, 2022

(51) Int. Cl.
| | |
|---|---|
| *H01L 23/48* | (2006.01) |
| *H01L 21/00* | (2006.01) |
| *H01L 21/44* | (2006.01) |
| *H01R 9/00* | (2006.01) |
| *H05K 7/00* | (2006.01) |

(Continued)

(52) U.S. Cl.
CPC .......... *H01L 24/14* (2013.01); *H01L 21/4853* (2013.01); *H01L 23/488* (2013.01); *H01L 23/528* (2013.01); *H01L 24/05* (2013.01); *H01L 24/06* (2013.01); *H01L 24/17* (2013.01);

(Continued)

(58) Field of Classification Search
CPC ......... H01L 2224/0401; H01L 2224/81; H01L 24/06; H01L 2924/15311; H01L 24/14; H01L 24/13; H01L 24/28; H01L 24/17; H01L 24/81; H01L 21/4853; H01L 23/488; H01L 23/528; H01L 24/05
See application file for complete search history.

(56) References Cited

U.S. PATENT DOCUMENTS 6,324,754 B1 * 12/2001 DiStefano .............. H05K 1/111
  361/764
7,566,970 B2 * 7/2009 Hung ...................... H01L 23/52
  257/737

(Continued)

FOREIGN PATENT DOCUMENTS

| CN | 106816429 A | 6/2017 |
| DE | 20221707 U1 | 4/2007 |
| KR | 20080061963 A | 7/2008 |

OTHER PUBLICATIONS

International search report dated May 5, 2022.

*Primary Examiner* — Alonzo Chambliss
(74) *Attorney, Agent, or Firm* — Ronald O. Neerings; Frank D. Cimino

(57) ABSTRACT

An electronic device includes one or more multinode pads having two or more conductive segments spaced from one another on a semiconductor die. A conductive stud bump is selectively formed on portions of the first and second conductive segments to program circuitry of the semiconductor die or to couple a supply circuit to a load circuit. The multinode pad can be coupled to a programming circuit in the semiconductor die to allow programming a programmable circuit of the semiconductor die during packaging. The multinode pad has respective conductive segments coupled to the supply circuit and the load circuit to allow current consumption or other measurements during wafer probe testing in which the first and second conductive segments are separately probed prior to stud bump formation.

47 Claims, 11 Drawing Sheets

(51) Int. Cl.
  *B23K 31/02* (2006.01)
  *H01L 23/00* (2006.01)
  *H01L 21/48* (2006.01)
  *H01L 23/528* (2006.01)
  *H01L 23/488* (2006.01)

(52) U.S. Cl.
  CPC .............. *H01L 24/28* (2013.01); *H01L 24/81* (2013.01); *H01L 2224/0401* (2013.01); *H01L 2224/81* (2013.01)

(56) References Cited

U.S. PATENT DOCUMENTS

| | | | | |
|---|---|---|---|---|
| 7,952,209 | B2* | 5/2011 | Feng | H01L 25/0657 |
| | | | | 257/784 |
| 8,890,338 | B2* | 11/2014 | Harris | H01L 23/544 |
| | | | | 257/781 |
| 9,685,402 | B2* | 6/2017 | Chen | H01L 22/12 |
| 2002/0011677 | A1* | 1/2002 | Yokoi | H01L 24/13 |
| | | | | 257/E23.021 |
| 2004/0065944 | A1* | 4/2004 | Shibata | H01L 24/05 |
| | | | | 257/E23.079 |
| 2007/0092999 | A1 | 4/2007 | Tellkamp | |
| 2013/0037934 | A1* | 2/2013 | Lin | H01L 23/5223 |
| | | | | 257/737 |

\* cited by examiner

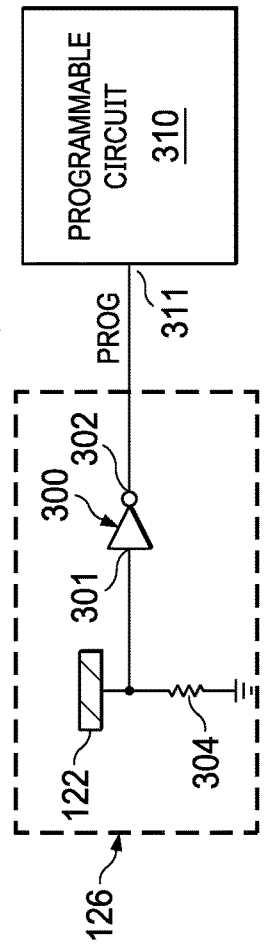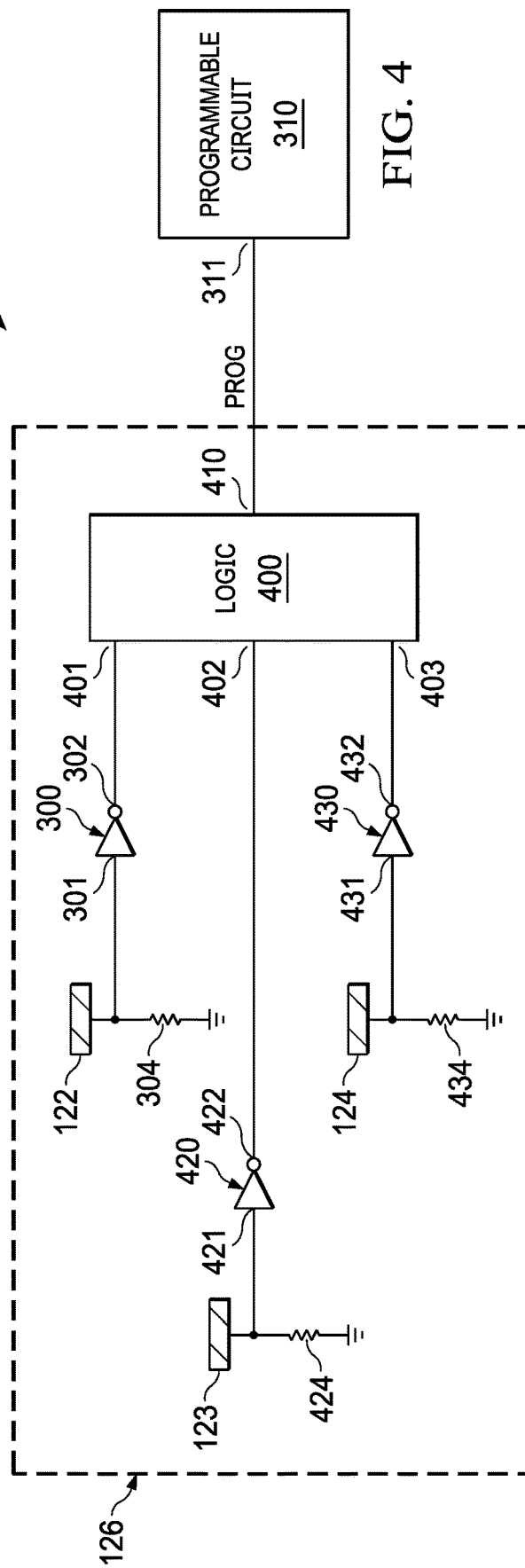

MULTI-FUNCTION BOND PAD

BACKGROUND

Packaged electronic devices, such as integrated circuits (ICs) are manufactured using one or more semiconductor dies. A semiconductor die may be fabricated with external connection points, such as guide pads, allowing selective enablement and/or programming of certain functions. This configurability of the semiconductor die facilitates use of the die in a variety of different products. Unlike programmable internal fuses or memory registers, die configuration through external connections is done using bond wires during packaging. However, bond wire interconnections are limited by design rules, particularly for multi-die electronic devices where bond wire density is high.

SUMMARY

According to one aspect, an electronic device comprises a semiconductor die with a multinode pad along a side of the semiconductor die. The multinode pad includes a first conductive segment exposed along the side of the semiconductor die and a second conductive segment exposed along the side of the semiconductor die. The second conductive segment is spaced from the first conductive segment along the side of the semiconductor die. The electronic device also comprises a conductive stud bump connecting a portion of the first conductive segment to a portion of the second conductive segment.

According to another aspect, an electronic device comprises a semiconductor die having a multinode pad. The multinode pad includes a first conductive segment exposed along a side of the semiconductor die and a second conductive segment exposed along the side of the semiconductor die. The second conductive segment is spaced from the first conductive segment along the side of the semiconductor die. The electronic device also comprises a supply circuit having an output coupled to the first conductive segment of the multinode pad, and a programming circuit having an input and an output. The input of the programming circuit is coupled to the second conductive segment of the multinode pad, and the output of the programming circuit is coupled to a programmable circuit of the semiconductor die.

According to a further aspect, a method of manufacturing an electronic device comprises forming a multinode pad on a side of a semiconductor die or wafer. The multinode pad includes a first conductive segment exposed along the side of the semiconductor die and a second conductive segment exposed along the side of the semiconductor die, and the second conductive segment is spaced from the first conductive segment along the side of the semiconductor die. The method further comprises forming a conductive stud bump on a portion of a first conductive segment of the multinode pad and on a portion of a second conductive segment of the multinode pad.

BRIEF DESCRIPTION OF THE DRAWINGS

FIG. 3 is a schematic diagram of a programming circuit coupled to a segment of a multinode pad in one implementation of the electronic device of FIGS. 1 and 2.

FIG. 4 is a schematic diagram of another example programming circuit coupled to multiple conductive segments of the electronic device in FIGS. 1 and 2.

DETAILED DESCRIPTION

Figure 1:
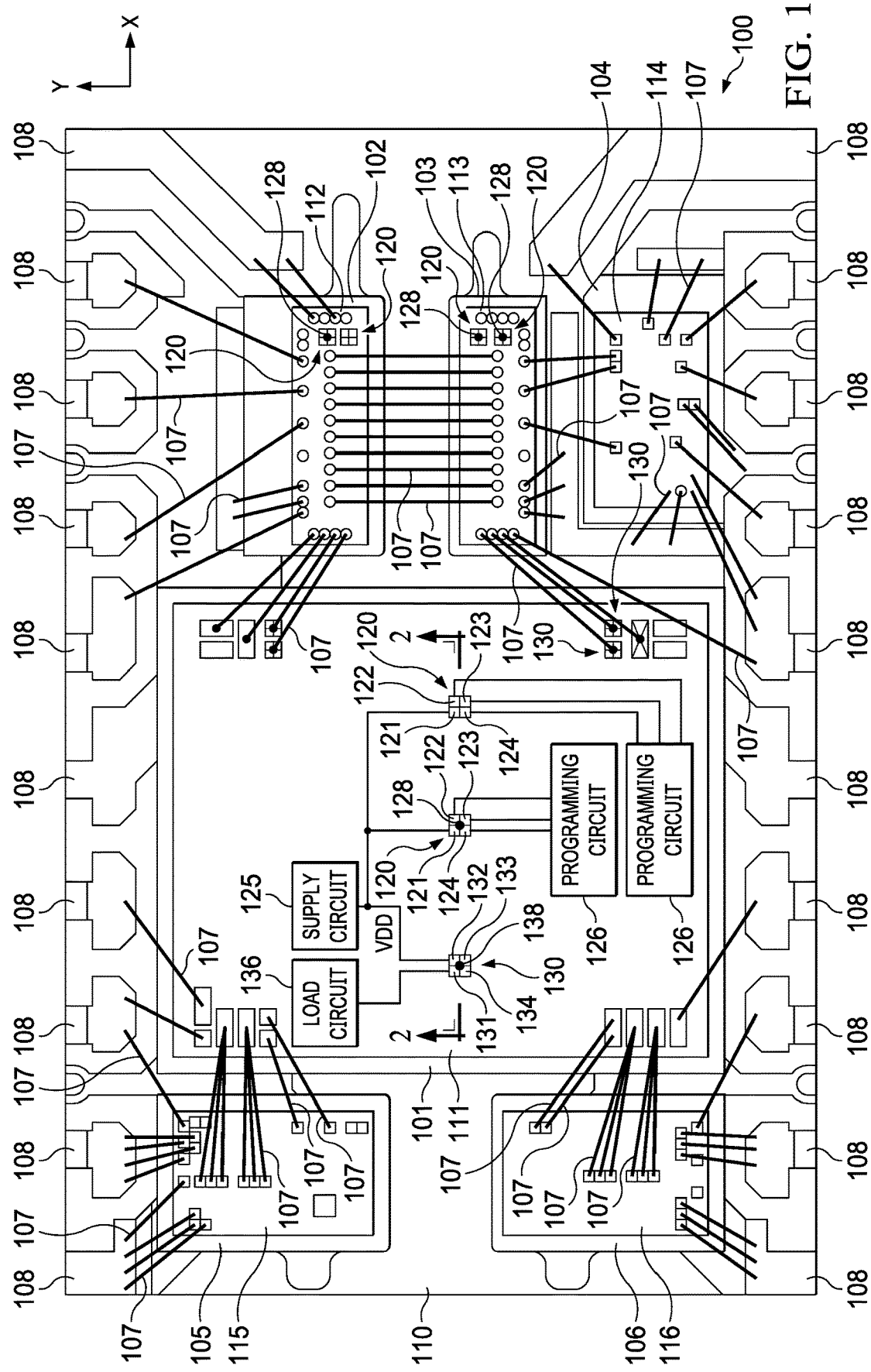
FIG. 1 is a top plan view of an electronic device having a semiconductor die with multinode pads for programming and wafer probe testing.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 2:
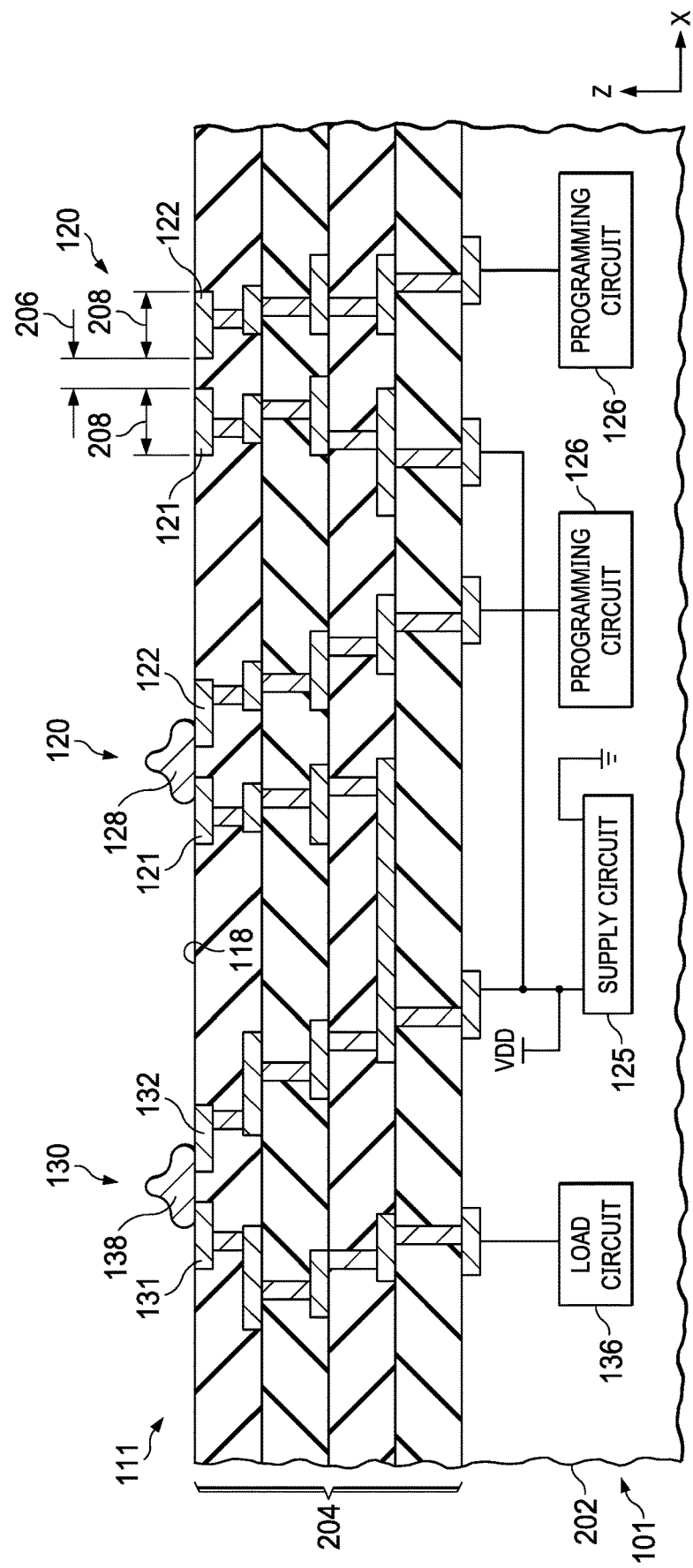
FIG. 2 is a partial sectional side elevation view of the electronic device taken along line 2-2 in FIG. 1.

Referring initially to FIGS. 1 and 2, FIG. 1 shows a packaged electronic device 100. The electronic device 100 in this example is an integrated circuit with multiple semiconductor dies mounted on the associated guide pads, with bond wire interconnections between certain of the semiconductor dies, as well as bond wire connections to leads to provide external electrical connection between circuitry of the semiconductor dies and external circuits of a host printed circuit board (PCB, not shown). The electronic device 100 also includes semiconductor dies that have one or more multinode pads, in which the individual multinode pads have two or more conductive segments spaced from one another on a side of the respective semiconductor die. The electronic device 100 has conductive stud bumps bridging the first and second conductive segments of select ones of the multinode pads to facilitate programming of programmable circuitry of individual dies during packaging, as well as allowing separate probing of the first and second conductive segments prior to stud bump formation during wafer probe testing. This allows use of a die design in multiple different products that use the same lead frames or different lead frames, with programmability during packaging without constraints due to bond wire density. In one implementation, the segments of one or more of the multinode pads are separately probed for current consumption testing during wafer probe testing, and the spaced apart segments are connected by the formation of a stud bump during packaging.

The electronic device 100 in FIG. 1 includes a first die attach pad 101 near the center of the product structure, and a second die attach pad 102, a third die attach pad 103 and a fourth die attach pad 104 to the right of the first die attach pad 101. Also, the electronic device 100 includes a fifth die attach pad 105 and a sixth die attach pad 106 to the left of the first die attach pad 101. The electronic device 100 includes bond wires 107 forming die-to-die and die-to-lead electrical connections. The electronic device 100 includes twenty conductive leads 108 positioned along the upper and lower sides in the top view of FIG. 1. A molded plastic packager structure 110 defines a top, bottom and four lateral sides of the substantially rectangular electronic device 100.

A first semiconductor die 111 is mounted to a top side of the first die attach pad 101. The electronic device 100 in FIG. 1 also includes a second semiconductor die 112 is mounted to a top side of the second die attach pad 102, a third semiconductor die 113 is mounted to a top side of the third die attach pad 103, a fourth semiconductor die 114 is mounted to a top side of the fourth die attach pad 104, a fifth semiconductor die 115 is mounted to a top side of the fifth die attach pad 105 and a sixth semiconductor die 116 is mounted to a top side of the sixth die attach pad 106. The bond wires 107 electrically interconnect conductive die pads of the semiconductor dies 111-116 with die pads of other dies and connect certain die pads with certain ones of the conductive leads 108.

The first, second and third semiconductor dies 111, 112 and 113 each have four segment multinode pads 120. The multinode pads 120 in this example are used for programming programmable circuitry within the respective semiconductor dies 111, 112 and 113. The first semiconductor die 111 also includes multinode pads 130 that are coupled between supply and load circuitry to allow localized current draw measurements during wafer probe testing prior to device singulation and packaging. Each multinode pad 120 in this example includes a first conductive segment 121 exposed along a top side 118 of the first semiconductor die 111, a second conductive segment 122 exposed along the top side 118 of the first semiconductor die 111, a third conductive segment 123 exposed along the top side 118 of the first semiconductor die 111 and a fourth conductive segment 124 exposed along the top side 118 of the first semiconductor die 111. The conductive segments 121-124 of the individual multinode pads 120 are spaced apart from one another. The conductive segments 121-124 in one example are or include copper. In another example, the conductive segments 121-124 are or include another conductive metal material, such as aluminum.

The multinode pads 120 of the first semiconductor die 111 are coupled to a supply circuit 125 and to respective programming circuits 126 as schematically shown in FIG. 1. The supply circuit 125 has an output coupled to the first conductive segment 121 of the multinode pads 120. In operation when the supply circuit 125 is powered, the output provides a supply voltage signal VDD to the first conductive segment 121 of the multinode pads 120. In one example, the supply circuit 125 is a low dropout (LDO) voltage regulator circuit that generates the supply voltage signal VDD at the output. The programming circuit 126 has inputs coupled to the respective second, third and fourth conductive segments 122, 123 and 124 of the multinode pad 120. The programming circuit 126 also has an output coupled to a programmable circuit, for example as illustrated and described below in connection with FIGS. 3 and 4.

In the example of FIG. 1, the conductive segments 121-124 of some of the multinode pads 120 are electrically coupled together by respective conductive stud bumps 128 formed on portions of top sides of the conductive segments 121-124. For these multinode pads 120, the conductive stud bump 128 the conductive segments 122, 123 and 124 are connected to the output of the supply circuit 125 to receive the supply voltage signal VDD when the supply circuit 125 is powered and operating. In one implementation, this connection causes the associated programming circuit 126 to provide a programming signal of a first value to a connected programmable circuit of the first semiconductor die 111. One multinode pad 120 of the first semiconductor die 111 has no conductive stud bump 128, thereby leaving the conductive segments 121-124 electrically disconnected from one another. In one implementation, this causes a pulldown circuit of the associated programming circuit 126 to provide a programming signal of a different second value to a connected programmable circuit of the first semiconductor die 111. In this fashion, the presence or absence of a conductive stud bump 128 can be used to program or otherwise set a programmable function of the circuitry of the first semiconductor die 111.

In the example of FIG. 1, moreover, the respective second and third semiconductor dies 112 and 113 each have two multinode pads 120. For the second semiconductor die 112, one of the multinode pads 120 has a conductive stud bump 128, whereas the other multinode pad 120 has no conductive stud bump 128. For the third semiconductor die 113 in this example, both multinode pads 120 have conductive stud bumps 128. A variety of different programming combinations can be used for each individual die 111, 112 and 113 to program many different combinations of programmable functions for the packaged electronic device 100.

The multinode pads 130 of the first semiconductor die 111 in this example also have four conductive segments 131, 132, 133 and 134 that are spaced apart from one another. The multinode pads 130 in this example are used for connection of the output of the supply circuit 125 to a power input of a load circuit 136. This configuration facilitates separate probing of the conductive segments 131-134 during wafer probe testing prior to packaging operations, after which a conductive stud bump 138 can be formed to electrically connect the conductive segments 131-134 during product packaging. In the illustrated example, the multinode pads 130 are structurally like the multinode pads 120, although not a strict requirement of all possible implementations.

The multinode pads 130 in FIG. 1 each include a first conductive segment 131 exposed along the top side 118 of the first semiconductor die 111, a second conductive segment 132 exposed along the top side 118 of the first semiconductor die 111, a third conductive segment 133 exposed along the top side 118 of the first semiconductor die 111 and a fourth conductive segment 134 exposed along the top side 118 of the first semiconductor die 111. The conductive segments 131-134 of the individual multinode pads 130 are spaced apart from one another. The conductive segments 131-134 in one example are or include copper. In another example, the conductive segments 131-134 are or include another conductive metal material, such as aluminum.

As with the multinode pads 120 discussed above, the presence of a conductive stud bump 138 electrically couples the conductive segments 131-134 to one another, in this case to connect the output of the supply circuit 125 to the power input of the associated load circuit 136. During wafer probe testing, however, the conductive segments 131-134 are electrically disconnected from one another, allowing separate probing of the conductive segments 131-134. In one example, this allows a wafer probe test system to connect current measurement circuitry between the first conductive segment 131 and the remaining conductive segments 132-134, to allow localized current consumption measurements for the associated load circuit 136 while they are powered during testing. Thereafter, a conductive stud bump 138 can be formed on the multinode pad 130 to electrically couple the conductive segments 131-134 thereof together for normal circuit operation with the load circuit 136 powered by the supply voltage signal VDD from the supply circuit 125.

In the example of FIG. 1, some multinode pads 130 are included on the top side 118 of the first semiconductor die 111, and the four conductive segments 131-134 thereof are connected by a stud bump of an associated one of the bond wires 107. This example allows separate probing of the conductive segments 131-134 of the multinode pads 130, for example, for wafer probe testing purposes, with the conductive segments 131-134 thereafter electrically coupled together during formation of the associated bond wire 107. In this example, the bond wire 107 can be used to interconnect the output of the supply circuit 125 with another semiconductor die (e.g., the third semiconductor die 113) during packaging operations, while still facilitating separate probing of the conductive segments 131-134 during wafer probe testing.

FIG. 2 shows a partial side view of the electronic device 100 taken along line 2-2 in FIG. 1 to further illustrate an example implementation of the multinode pads 120 and 130 and interconnection thereof with circuitry of the associated first semiconductor die 111. The various circuits 125, 126 and 136 are illustrated and simplified form, and are constructed using wafer processing steps to form transistors, resistors, capacitors, etc. on or in a semiconductor wafer 202, such as silicon. The first semiconductor die 111 also includes a multilevel metallization structure 204 formed on a top side of the semiconductor wafer 202. Following metallization processing, the semiconductor wafer is simulated or separated (e.g., by saw cutting) to provide multiple semiconductor dies 111. For sake of simplicity, the first semiconductor die 111 is referred to herein as a die, or alternatively as a wafer, depending on the stage of fabrication processing.

The load circuit 136 is formed on or in the semiconductor wafer 202. The power input of the load circuit 136 is connected by a contact, as well as conductive vias and patterned metallization layer traces to electrically connect the input of the load circuit 136 to the first conductive segment 131 of the multinode pad 130. The associated conductive stud bump 138 is formed on portions of the first and second conductive segments 131 and 132, and thereby electrically couples the power input of the load circuit 136 to the output of the supply circuit 125. The output of the supply circuit 125 is connected by a conductive contact, conductive vias, and metallization layer traces to the second conductive segment 132. The metallization structure 204 also electrically couples the output of the supply circuit 125 to the first conductive segments 121 of the illustrated multinode pads 120. The first multinode pad 120 has an associated conductive stud bump 128 formed thereon, whereas the second illustrated multinode pad 120 in this example has no conductive stud bump. The conductive stud bump 128 electrically couples the first and second conductive segments 121 and 122, which couples the output of the supply circuit 125 to the input of a first programming circuit 126.

The output of the supply circuit 125, however, is not coupled to the second conductive segment 122 of the other multinode pad 120 since no conductive stud bump 128 is formed thereon. As discussed further below in connection with FIGS. 3 and 4, the programming circuits 126 each include a pulldown resistor coupled between the second conductive segment 122 of the multinode pad 120 and a ground or common reference of the supply circuit 125. In this example, therefore, the absence of a conductive stud bump 128 on the multinode pad 120 causes the input to the associated programming circuit 126 to be at 0 V, whereas the presence of a conductive stud bump 128 causes the input to the programming circuit 126 to be at the voltage of the supply voltage signal VDD.

FIG. 3 schematically illustrates an example programming circuit 126 in the first semiconductor wafer 202. In this example, the second conductive segment 122 is electrically coupled (e.g., in the metallization structure 204 of FIG. 2) to an input 301 of an inverter 300. The inverter 300 has an output 302 coupled to an input 311 of a programmable circuit 310. A pulldown resistor 304 is coupled between the input 301 and a ground or common reference (e.g., of the supply circuit 125 in FIGS. 1 and 2). With no conductive stud bump connecting the second conductive segment 122 to a supply voltage signal, the pulldown resistor 304 ensures that the voltage at the input 301 of the inverter 300 is at or near the ground reference voltage, and the output 302 of the inverter 300 provides a logic high output signal to the input 311 of the programmable circuit 310. In contrast, when a conductive stud bump electrically couples the second conductive segment 122 of the multinode pad to a supply voltage signal (e.g., VDD), the voltage of the input 301 of the inverter 300 is at the voltage of the supply voltage signal, and the output 302 of the inverter 300 provides a logic low output signal to the input 311 of the programmable circuit 310. In this manner, the presence or absence of a conductive stud bump provides Boolean programmability of the programmable circuit 310 which is set or established during packaging operations in the fabrication of the electronic device 100.

FIG. 4 shows another example programming circuit configuration coupled to multiple conductive segments 122-124 of the multinode pad 120. In this example, each of the conductive segments 122-124 is coupled to the input of an inverter. The second conductive segment 122 is coupled to the pulldown resistor 304 and the input 301 of the inverter 300 as described above in connection with the example of FIG. 3. The third conductive segment 123 in this example is coupled to a pulldown resistor 424 and the input 421 of an inverter 420, and the inverter 420 has an output 422. Similarly, the fourth conductive segment 124 is coupled to a pulldown resistor 434 and an input 431 of another inverter 430, which has an inverter output 432.

The programming circuit 126 in FIG. 4 also includes a logic circuit 400 with a first input 401 coupled to the output 302 of the inverter 300, a second input 402 coupled to the output 422 of the inverter 420, and a third input 403 coupled to the output 432 of the inverter 430. The logic circuit 400 is formed on or in the semiconductor wafer 202, and receives Boolean (e.g., high or low) signals from the respective inverters 300, 420 and 430. The logic circuit 400 has an output 410 coupled to the input 311 of the programmable circuit 310. In one implementation, the logic circuit 400 is configured to provide an output programming signal PROG (e.g., a voltage signal) at the output 410 having one of two discernible states, where a first state of the logic circuit output signal indicates that two or more of the signals that the logic circuit input 401-403 have a logic low value, interpreted as the presence of a conductive stud bump 128 on the four-segment multinode pad 120. Otherwise (less than two of the input signals have a logic low value), the logic circuit 400 provides the output programming signal PROG at the output 410 in a second state, which is interpreted by the programmable circuit 310 as indicating that no conductive stud bump is present on the multinode pad 120. In this manner, the example logic circuit 400 accommodates the possibility of conductive manufacturing artifacts that inadvertently short circuit two of the conductive segments 121-124, while still allowing correct programming of the programmable circuit 310 according to the actual presence or absence of a conductive stud bump 128.

The programmable circuit 310 is configured to implement one of multiple circuit configurations and/or functions in operation of the electronic device 100 based on the programming signal PROG from the logic circuit 400. In another implementation, a single programmable circuit is coupled with multiple programming circuits 126, each of which provides a single bit of a multi-bit configuration signal, for example, to facilitate programming of more than two circuit configurations and/or functions of the associated semiconductor die in the electronic device 100. In one example, the semiconductor die 111 is a charging controller for a USB charger, and is configurable for charging at multiple different current levels, such as for normal charging and fast charging. This allows use of the semiconductor die 111 in a variety of different charger products, with the die configuration occurring during packaging operations, rather than during wafer processing.

Figure 5:
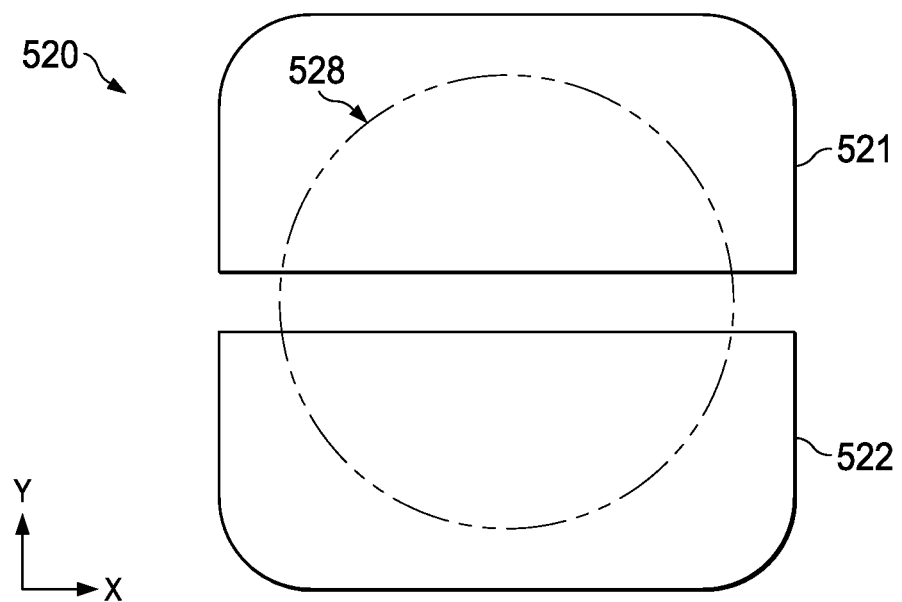
FIG. 5 is a partial top plan view of an example two segment multinode pad.

FIGS. 5-8 show partial top views of several multinode pad examples. A multinode pad includes any integer number N conductive segments, where N is greater than or equal to 2. FIG. 5 shows an example two segment multinode pad 520 having first and second conductive segments 521 and 522. The conductive segments 521 and 522 in this example are generally rectangular, although not a strict requirement of all possible implementations. The conductive segments 521 and 522 are spaced apart from one another along a side of the associated semiconductor die to allow selective electrical coupling by the formation of a conductive stud bump over portions of the conductive segments 521 and 522. FIG. 5 also shows a prospective conductive stud bump location 528 in dashed line.

Figure 6:
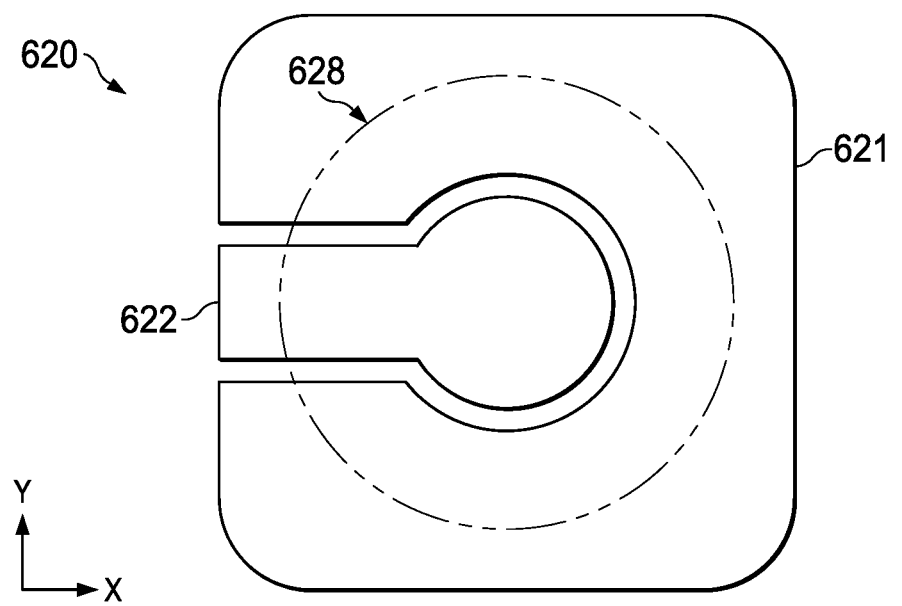
FIG. 6 is a partial top plan view of another example two segment multinode pad.

FIG. 6 shows another example two segment multinode pad 620 having a first conductive segment 621 with a generally rectangular form, and a second conductive segment 622 at least partially encircled by the first conductive segment 621. The conductive segments 621 and 622 are spaced apart from one another along a side of the associated semiconductor die to allow selective electrical coupling by the formation of a conductive stud bump over portions of the conductive segments 621 and 622. FIG. 6 also shows a prospective conductive stud bump location 628 in dashed line.

Figure 7:
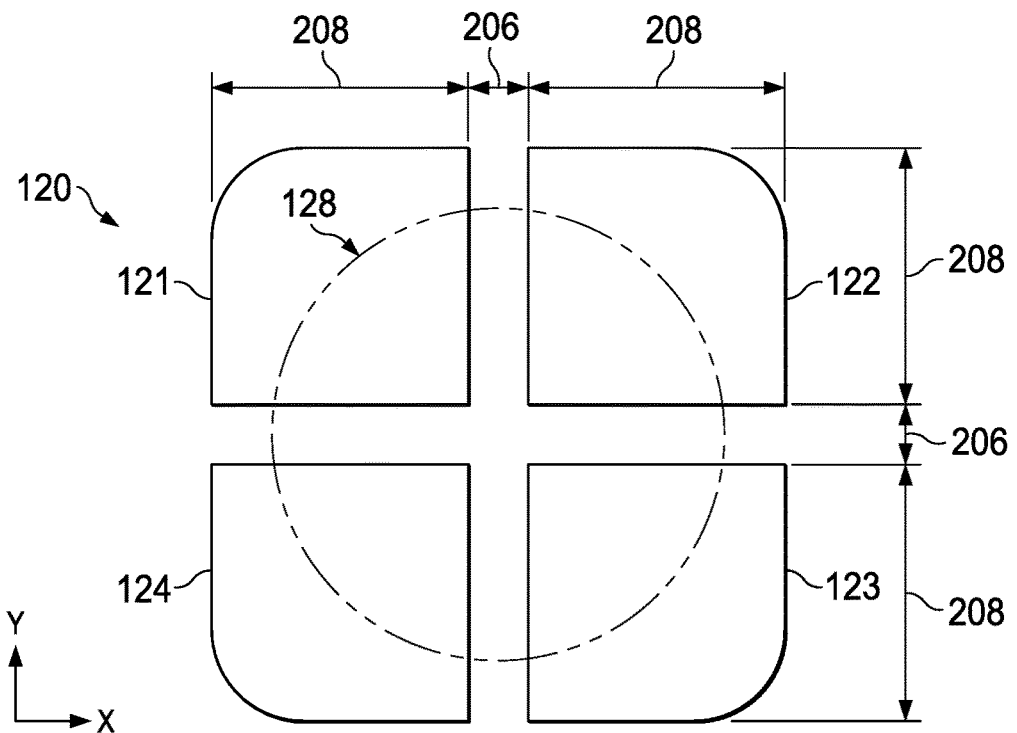
FIG. 7 is a partial top plan view of an example four segment multinode pad in the electronic device of FIGS. 1-4.
Figure 8:
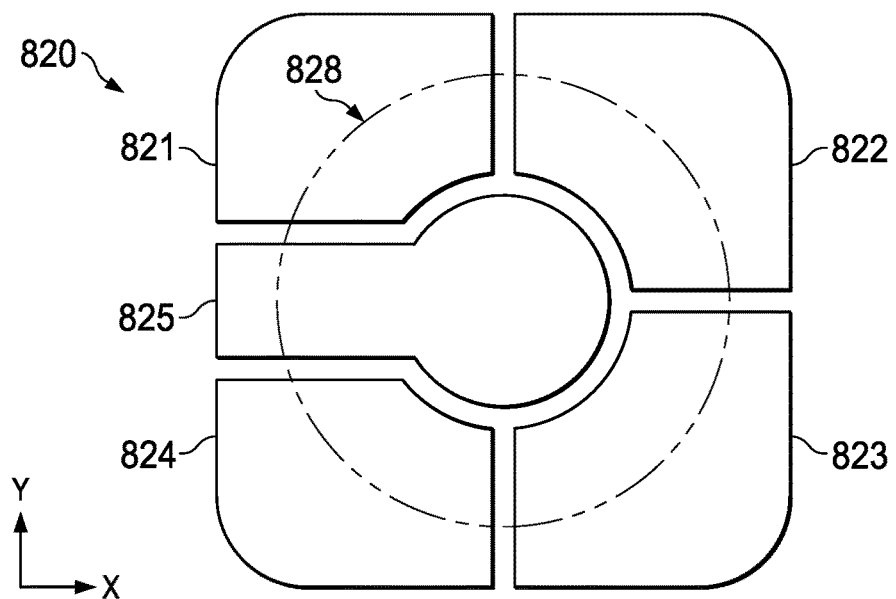
FIG. 8 is a partial top plan view of an example five segment multinode pad.

FIG. 7 shows the example four segment multinode pad 120 illustrated and described above in connection with the electronic device 100 of FIGS. 1-4. This example includes generally rectangular conductive segments 121-124, each spaced apart from the other conductive segments by a gap distance 206 and having length and width dimensions 208. In this example, the conductive segments 121-124 are of generally similar shape, although not a strict requirement of all possible implementations. FIG. 8 shows an example five segment multinode pad 820 having a first conductive segment 821, a second conductive segment 822, a third conductive segment 823, a fourth conductive segment 824, and a fifth conductive segment 825 which is at least partially surrounded by the first through fourth conductive segments 821-824.

The conductive segments of the multinode pads 120, 520, 620 and 820 are spaced apart from one another by a gap distance 206, illustrated in FIG. 7 for the example multinode pad 120. In certain implementations, the gap distance 206 is set large enough to allow separate probing of individual conductive segments, for example, using a wafer probe head with standard wafer probe needles without short-circuiting the probe conductive segments. In addition, the gap distance 206 is set small enough to allow reliable formation of a conductive stud bump over portions of adjacent conductive segments. In one example, the gap distance is 1 µm or more and 100 µm or less. In another example, the gap distance 206 is 10 µm or more and 30 µm or less. In yet another example, the gap distance 206 is 50 µm or more and 100 µm or less.

Figure 9:
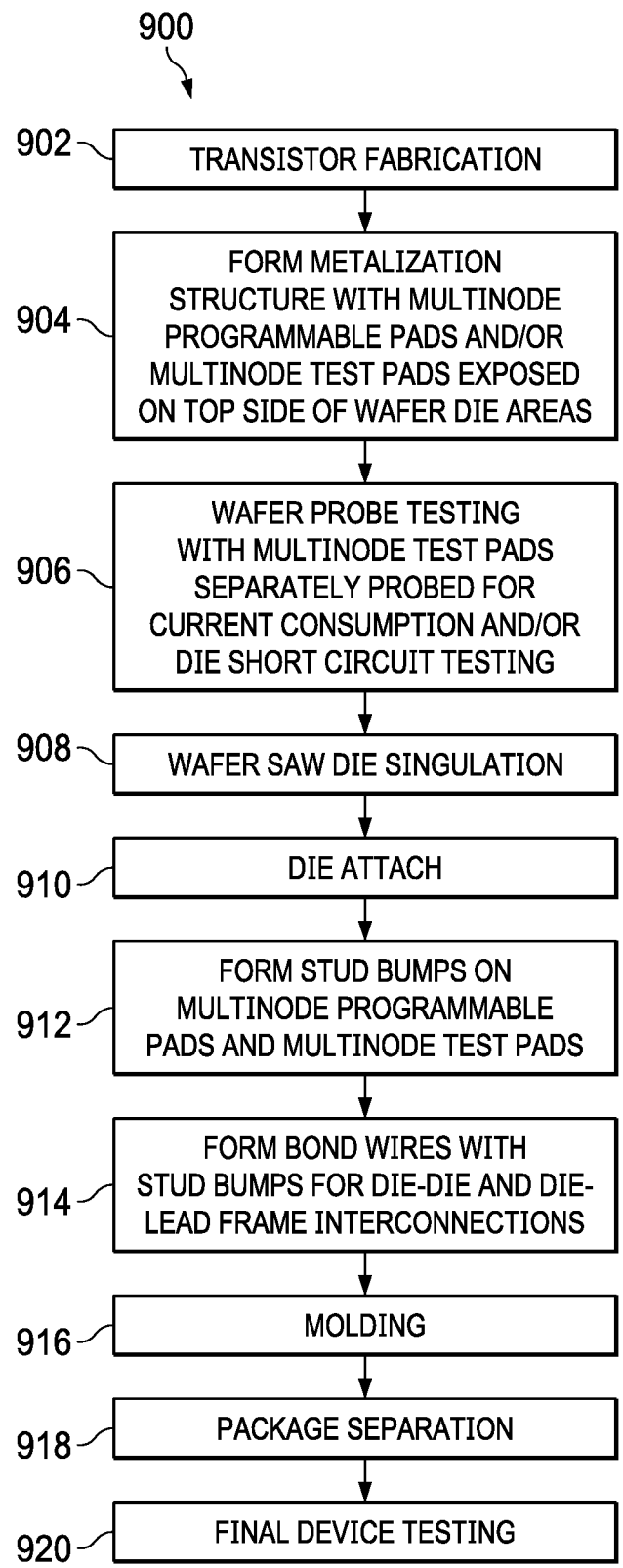
FIG. 9 is a flow diagram of a method of manufacturing an electronic device.
Figure 10:
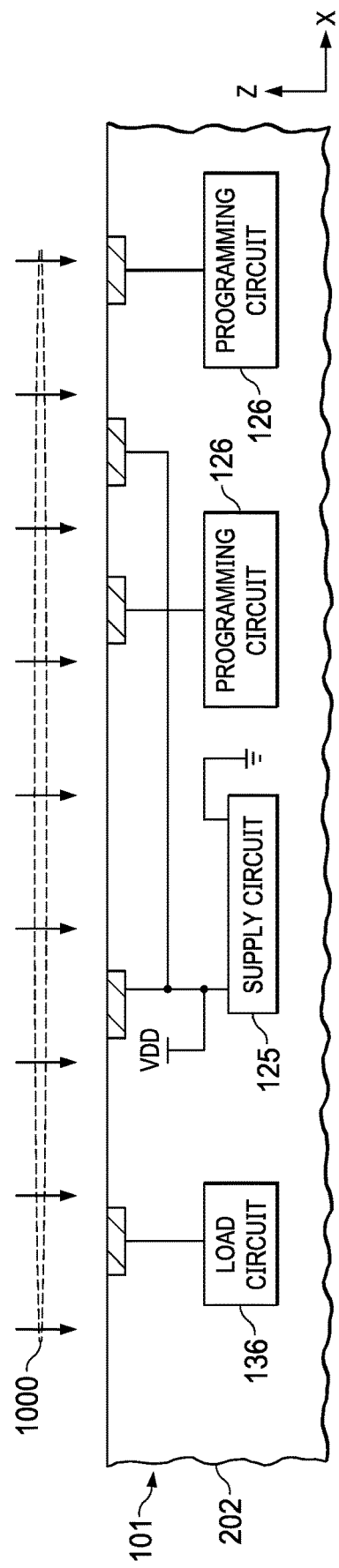
FIG. 10 is a partial sectional side elevation view of a semiconductor wafer undergoing a fabrication process.

Referring now to FIGS. 9-14, FIG. 9 shows an example method 900 of manufacturing an electronic device, and FIGS. 10-14 show the example packaged electronic device 100 undergoing fabrication processing according to one example implementation of the method 900. The method 900 begins at 902 in FIG. 9 with transistor fabrication. FIG. 10 shows the example semiconductor wafer 202 undergoing a fabrication process 1000 that includes wafer processing to form transistors, resistors, and other circuit components on or in the semiconductor wafer 202. As previously discussed, FIG. 10 schematically illustrates the example supply circuit 125, programming circuits 126 and the load circuit 136, wherein specific details of the transistor implementations of the circuits is omitted to avoid obscuring the various aspects of the present disclosure.

Figure 11:
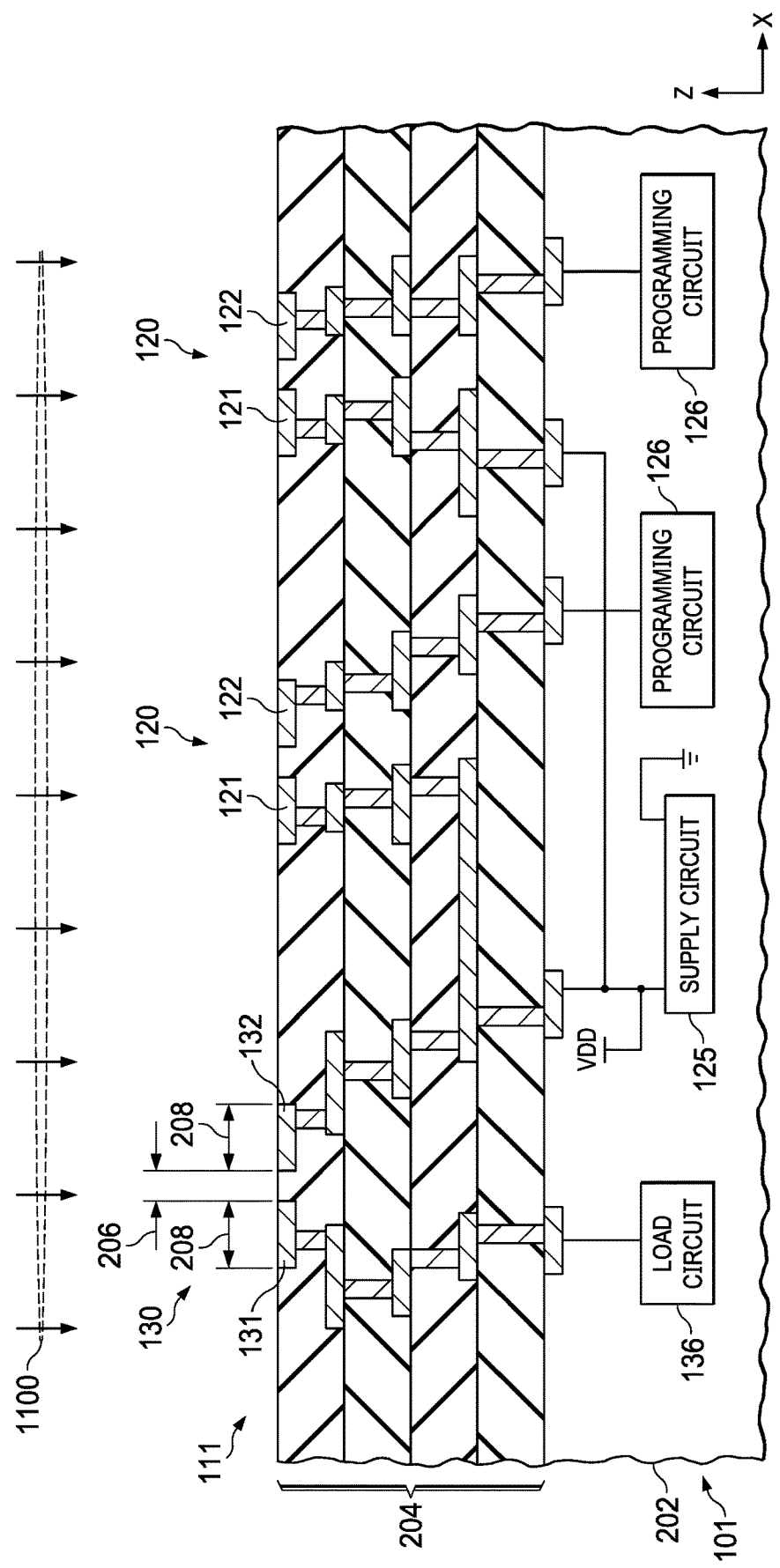
FIG. 11 is a partial sectional side elevation view of the semiconductor wafer of FIG. 10 undergoing a metallization fabrication process.

At 904 in FIG. 9, the method 900 continues with metallization layer processing. FIG. 11 shows the semiconductor wafer 202 undergoing a metallization fabrication process 1100 that forms the metallization structure 204 on a top side of the semiconductor wafer 202. The metallization structure 204 includes an uppermost or top layer having the conductive segments 121, 122, 131 and 132 of the respective multinode programmable pads 120 and/or multinode test pads 130. The process 1100 in one example forms multinode programmable pads 120, 130 having any integer number N conductive segments, where N is greater than or equal to 2. As discussed above, the multinode pads 120 in this example are used to program configurations and/or functions of the finished packaged electronic device by the selective presence or absence of a conductive stud bump 128, and the multinode pads 130 are used for wafer probe testing with separate probing of the associated conductive segments 131 and 132. As shown in FIG. 11, moreover, the metallization process 1100 forms the individual conductive segments (e.g., copper) with the designated segment dimensions 208 and the gap distance 206 discussed above. The process 1100 leaves the upper portions of the conductive segments 121, 122, 131 and 132 exposed along the top side 118 of the wafer used to create the first semiconductor die 111 to allow subsequent bond wire or stud bump connections thereto.

Figure 12:
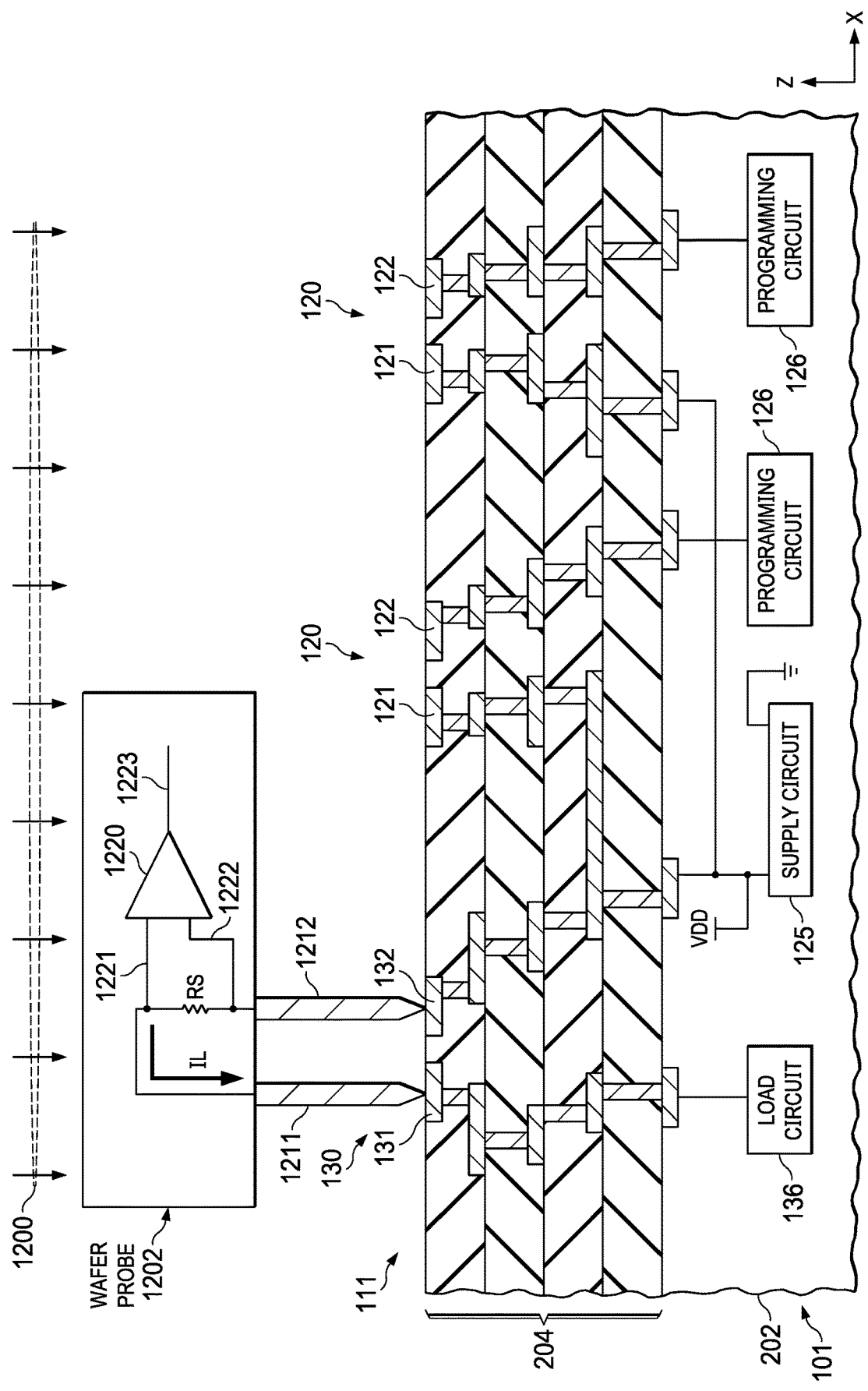
FIG. 12 is a partial sectional side elevation view of the semiconductor wafer of FIGS. 10 and 11 undergoing a wafer probe testing process.

The method 900 continues with wafer probe testing at 906 in FIG. 9. FIG. 12 shows the semiconductor wafer 202, 204 undergoing a wafer probe testing process 1200 using a wafer probe 1202 that separately engages the first and second conductive segments 131 and 132 with respective wafer probe needles 1211 and 1212. In this example, the wafer probe 1202 includes current sensing circuitry to measure a current drawn by the load circuit 136 from the supply circuit 125. This example includes a sense resistor RS with first and second ends coupled to the respective first and second wafer probe needles 1211 and 1212. A sense amplifier 1220 includes a first input 1221 coupled to the first probe needle 1211, and a second input 1222 coupled to the second probe needle 1212. The amplifier 1220 senses the voltage across the sense resistor RS and includes an output 1223 that provides an output signal that represents the load current IL consumed by the load circuit 136.

At 908 in FIG. 9, the method 900 further includes wafer saw die singulation that separates individual semiconductor dies from the processed wafer. The method 900 also includes packaging operations, including die attach processing at 910 that attaches one or more semiconductor dies to a lead frame or substrate. FIG. 1 above shows one example in which six individual semiconductor dies 111-116 are attached at 910 to the respective die attach pads 101-106 of a starting lead frame, for example, using an adhesive epoxy.

Figure 13:
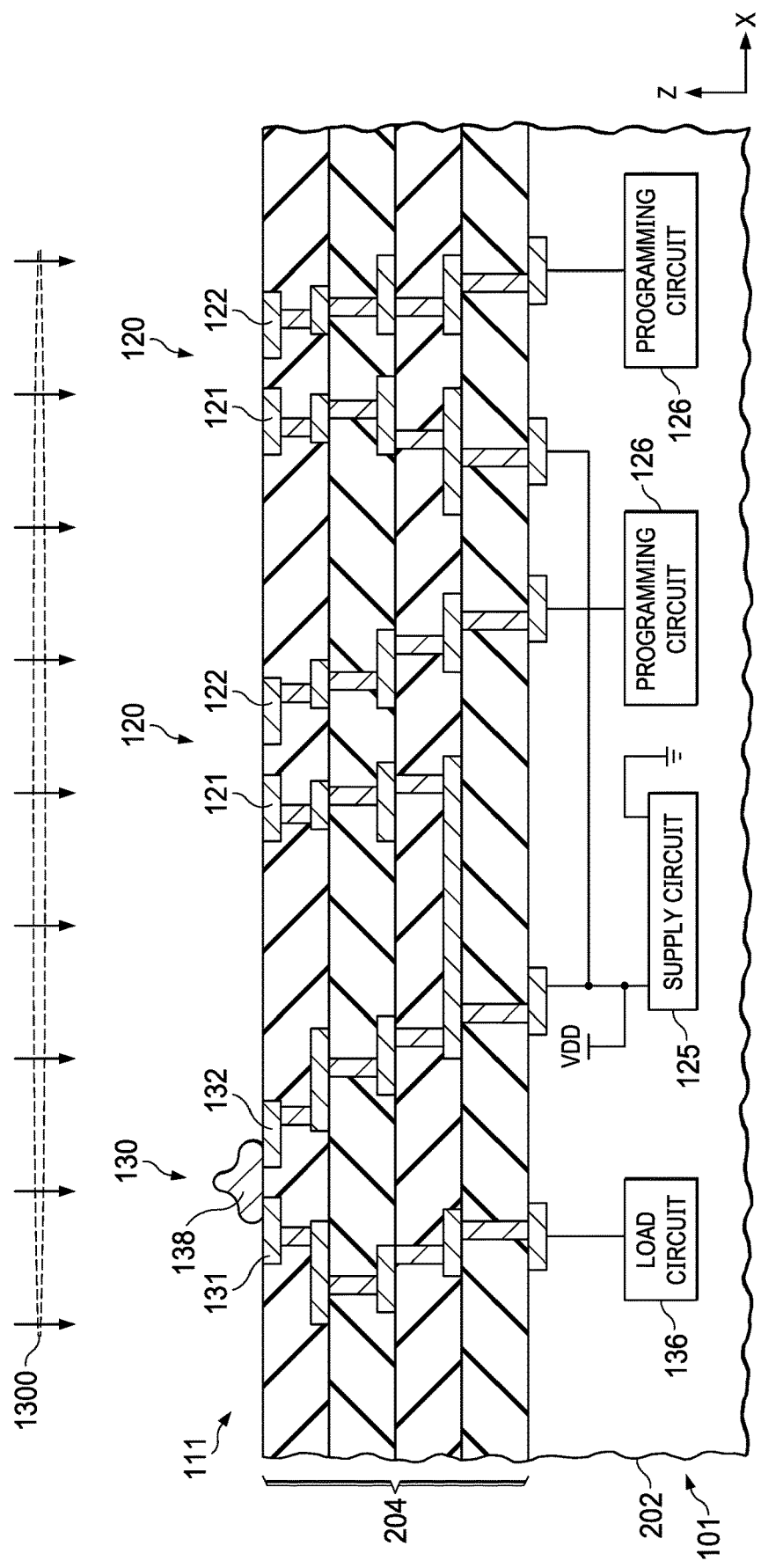
FIG. 13 is a partial sectional side elevation view of the semiconductor die of FIGS. 1 and 2 undergoing a wire bonding process that forms a first stud bump on portions of first and second conductive segments of a multinode pad.
Figure 14:
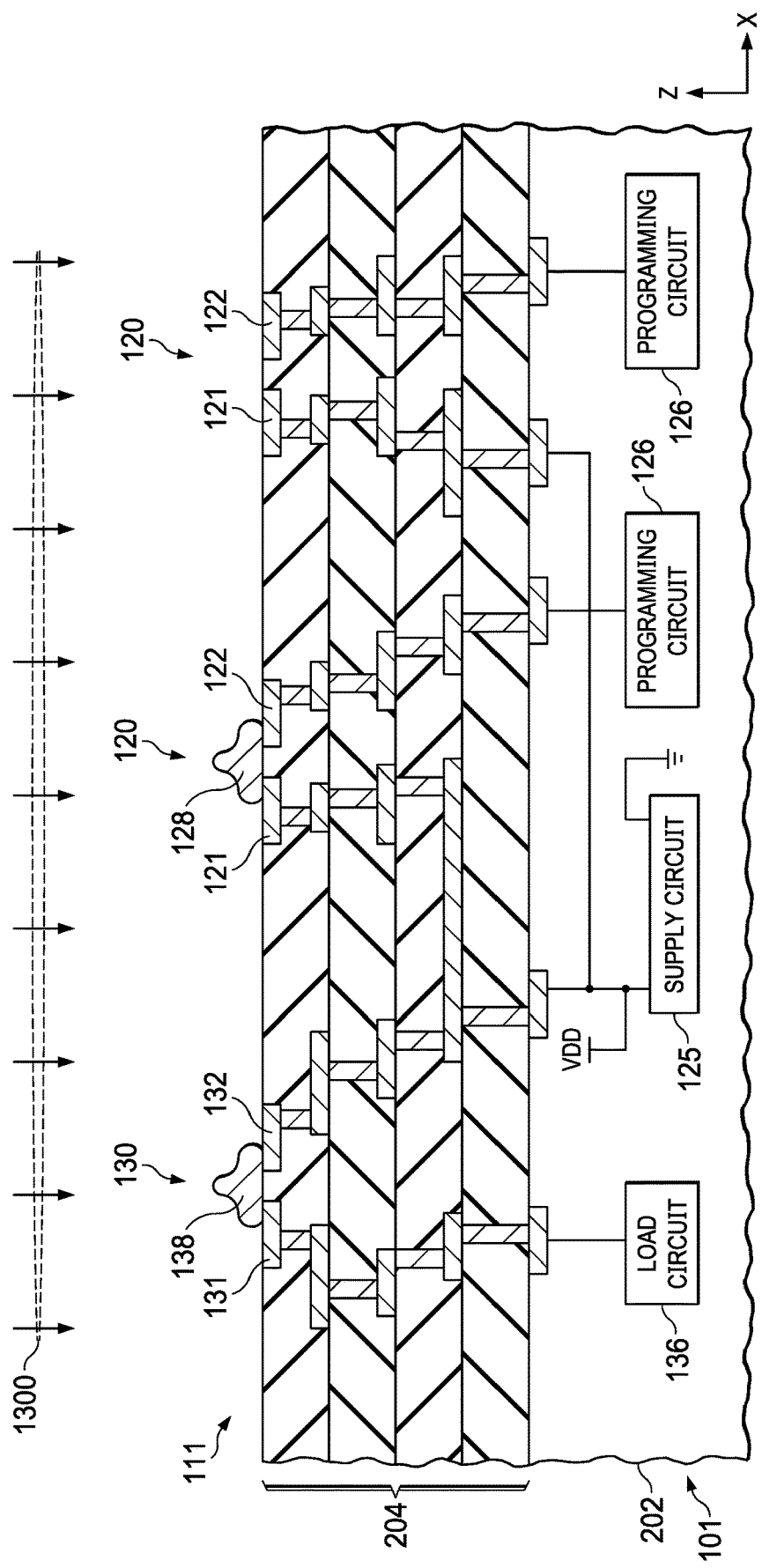
FIG. 14 is a partial sectional side elevation view of the semiconductor die of FIG. 13 undergoing continued wire bonding processing that forms a second conductive stud bump on portions of first and second conductive segments of another multinode pad.

The method 900 continues at 912 and 914 with formation of conductive stud bumps and conductive bond wires using a modified wire bonding process. Stud bump formation at 912 in one example is implemented using a standard wire bonding process and associated equipment, in which a wire bonding tool forms an initial stud bump locations corresponding to die pads of one of the semiconductor dies 111-116. Rather than extending the bond wire from the initial stud bump to terminate at another die pad of the same or a different die or lead, the stud bump formation at 912 terminates the connection after the stud bump 128, 138 is formed. FIG. 13 shows a portion of the first semiconductor die 111 undergoing a wire bonding process 1300 that forms a first stud bump 138 on portions of the first and second conductive segments 131 and 132 of the multinode pad 130. FIG. 14 shows continuation of the wire bonding process 1300 that forms a second conductive stud bump 128 on portions of the first and second conductive segments 121 and 122 of another multinode pad 120.

In this example, the wire bonding process 1300 is continued at 914 in FIG. 9 to form other stud bumps and completed bond wires according to an electronic device specification, including selective programming of individual semiconductor dies by forming or refraining from forming a stud bump 128, 138 on selected multinode pads 120, 130.

Although the partial side section views of FIGS. 13 and 14 illustrate only two conductive segments of the respective illustrated multinode pads 120 and 130, the example processing selectively forms stud bumps 128, 130 on portions of all four conductive segments thereof, and similar processing is used to form stud bumps on portions of conductive segments of multinode pads having different shapes (e.g., FIGS. 5-8 above).

The method 900 continues at 916 in FIG. 9 with molding processing to form a package structure (e.g., 110 in FIG. 1 above) that includes a molding compound, along with package separation at 918 that singulates or separates individual packaged electronic devices from one another to provide the packaged electronic device 100 illustrated in FIG. 1 above. The process 900 in one example also includes final device testing at 920 perform electrical testing of the finished packaged electronic device 100.

The described examples facilitate semiconductor die and a packaged electronic device programming for different circuit configurations and/or functions by selectively adding conductive stud bumps 128, 138 at least partially across multinode pads on the tops of the programmable dies 111-113 during product packaging. The illustrated examples provide the programming flexibility of bond wire programming with the additional benefit of reduced programming feature to facilitate use of external programmability even where a final product device configuration has high bond wire density. In this manner, the programming connections by the conductive stud bumps 128, 138 do not overlap other bond wire connections in the packaged electronic device 100 and can be placed at any convenient location on the top side of the semiconductor die 111-113. Certain examples can combine the conductive stud bump formation with other wire bonding processes to mitigate or avoid increased cost or complexity of the electronic device 100 and/or the manufacturing processes used in fabricating the electronic device 100. In addition, the stud bump programming examples can reduce product cost compared with configuration using full bond wires to reduce the material costs, particularly for gold bond wires. These advantages are in addition to the increased flexibility to implement programmable features on a given semiconductor die in high wire density locations that were previously not bondable.

The described examples facilitate conformance with assembly rule checker specifications that determine feasibility of specific bond wire connections, for example for connected cross wires where bond wire length is high, and which check for bond wire bond head tool clearance to ensure the bond wire tool can physically fit into the desired area above a die pad or multinode pad. In this regard, the stud bump formation in one example can be done prior to actual bond wire formation to facilitate bond head clearance for a given electronic device design. The described examples and techniques mitigate or avoid prior limitations regarding the maximum number of bond wires that can be bonded from a die pad to a device lead or to another die.

In addition, the selective use of multinode pads 130 and conductive stud bumps 138 can facilitate the provision of separately probable conductive segments (e.g., 131 and 132 above) to allow localized testing during wafer probe test, followed by formation of a conductive stud bump 138 to make a final connection between the conductive segments for the desired operation of the finished electronic device 100. In one example, this facilitates localized testing of digital logic circuits through the conductive segments of a multinode pad 130, in which the wafer probe test equipment applies power to the conductive segment 131 or provides an interconnection path between the conductive segments 132 and 131 to allow the tester to monitor the load current IL to obtain low-level quiescent current (IDDM) measurements to detect small leakage current outliers during wafer probe testing.

Modifications are possible in the described examples, and other implementations are possible, within the scope of the claims.

What is claimed is:
1. An electronic device, comprising:
   a semiconductor die having a multinode pads, each multinode pad including: a first conductive segment exposed along a side of the semiconductor die, a second conductive segment exposed along the side of the semiconductor die, the second conductive segment spaced from the first conductive segment along the side of the semiconductor die; and
a conductive stud bump connecting a portion of the first conductive segment to a portion of the second conductive segment on a first of the multinode pads and no conductive stud bump connecting a portion of the first conductive segment to a portion of the second conductive segment on a second of the multinode pads.

2. The electronic device of claim 1, further comprising:
a supply circuit having an output coupled to the first conductive segment of the first multinode pad; and
a programming circuit having an input and an output, the input of the programming circuit coupled to the second conductive segment of the first multinode pad, and the output of the programming circuit coupled to a another programmable circuit of the semiconductor die.

3. The electronic device of claim 2, the semiconductor die further comprising:
a programming circuit having an input and an output, the input of the programming circuit coupled to the second conductive segment of the first multinode pad, and the output of the programming circuit coupled to another programmable circuit of a semiconductor die.

4. The electronic device of claim 3, further comprising:
a second conductive stud bump connecting a portion of the first conductive segment of the second multinode pad to a portion of the second conductive segment of the second multinode pad.

5. The electronic device of claim 1, wherein the second conductive segment of the multinode pad is spaced from the first conductive segment of the first multinode pad by a gap distance of 1 µm or more and 100 µm or less.

6. The electronic device of claim 5, wherein the gap distance is 10 µm or more and 30 µm or less.

7. The electronic device of claim 5, wherein the gap distance is 50 µm or more and 100 µm or less.

8. The electronic device of claim 5, further comprising:
a supply circuit having an output coupled to the first conductive segment of the first multinode pad; and
a programming circuit having an input and an output, the input of the programming circuit coupled to the second conductive segment of the first multinode pad, and the output of the programming circuit coupled to another programmable circuit of the semiconductor die.

9. The electronic device of claim 5, further comprising:
a load circuit having a power input coupled to the first conductive segment of the first multinode pad; and
a supply circuit having an output coupled to the first conductive segment of the first multinode pad.

10. The electronic device of claim 9, further comprising an additional multinode pad coupling the load circuit to the supply circuit.

11. The electronic device of claim 1, further comprising:
a load circuit having a power input coupled to the first conductive segment of the first multinode pad; and
a supply circuit having an output coupled to the first conductive segment of the first multinode pad.

12. The electronic device of claim 11, further comprising an additional multinode pad coupling the load circuit to the supply circuit.

13. The electronic device of claim 1, further comprising:
a load circuit having a power input coupled to the first conductive segment of the first multinode pad; and
a supply circuit having an output coupled to the multinode pad.

14. The electronic device of claim 13, further comprising another multinode pad coupling the load circuit to the supply circuit.

15. The electronic device of claim 1, the multinode pad further comprising a third conductive segment exposed along the side of the semiconductor die, the third conductive segment spaced from the first conductive segment along the side of the semiconductor die, and the third conductive segment spaced from the second conductive segment along the side of the semiconductor die; wherein the conductive stud bump connects a portion of the third conductive segment to the portion of the first conductive segment and the portion of the second conductive segment.

16. The electronic device of claim 6, the multinode pad further comprising a fourth conductive segment exposed along the side of the semiconductor die, the fourth conductive segment spaced from the first conductive segment, the second conductive segment and the third conductive segment along the side of the semiconductor die.

17. The electronic device of claim 16, the multinode pad further comprising a fifth conductive segment exposed along the side of the semiconductor die, the fifth conductive segment spaced from the first conductive segment, the second conductive segment, the third conductive segment and the fourth conductive segment along the side of the semiconductor die.

18. The electronic device of claim 17, wherein the fifth conductive segment is at least partially encircled by the first, second, third and fourth conductive segments.

19. An electronic device, comprising:
a semiconductor die at least two multinode each multinode pad including: a first conductive segment exposed along a side of the semiconductor die, a second conductive segment exposed along the side of the semiconductor die, the second conductive segment spaced from the first conductive segment along the side of the semiconductor die
a supply circuit having an output coupled to the first conductive segment of the first multinode pad;
a programming circuit having an input and an output, the input of the programming circuit coupled to the second conductive segment of the multinode pad, and the output of the programming another circuit coupled to a programmable circuit of the semiconductor die; and a conductive material connecting a portion of the first conductive segment to a portion of the second conductive segment on a first of the multinode pads and no conductive material connecting a portion of the first conductive segment to a portion of the second conductive segment on a second of the multinode pads.

20. The electronic device of claim 19, wherein the conductive material is; a conductive stud bump connecting a portion of the first conductive segment to a portion of the second conductive segment.

21. The electronic device of claim 19, wherein the second conductive segment of the multinode pad is spaced from the first conductive segment of the multinode pad by a gap distance of 1 µm or more and 100 µm or less.

22. The electronic device of claim 19, further comprising:
a load circuit having a power input coupled to the first conductive segment of the first multinode pad; and
a supply circuit having an output coupled to the first conductive segment of the first multinode pad.

23. The electronic device of claim 22, further comprising an another multinode pad coupling the load circuit to the supply circuit.

24. The electronic device of claim 19, wherein:
the multinode pad further comprises a third conductive segment exposed along the side of the semiconductor die, the third conductive segment spaced from the first conductive segment along the side of the semiconductor die, and the third conductive segment spaced from the second conductive segment along the side of the semiconductor die; and the programming circuit having a second input, a second output and a logic circuit, the second input of the programming circuit coupled to the third conductive segment, the output of the programming circuit coupled to a first input the logic circuit, and the second output of the programming circuit coupled to a second input of the logic circuit.

25. The electronic device of claim 24, the multinode pad further comprising a fourth conductive segment exposed along the side of the semiconductor die, the fourth conductive segment spaced from the first conductive segment, the second conductive segment and the third conductive segment along the side of the semiconductor die.

26. The electronic device of claim 25, the multinode pad further comprising a fifth conductive segment exposed along the side of the semiconductor die, the fifth conductive segment spaced from the first conductive segment, the second conductive segment, the third conductive segment and the fourth conductive segment along the side of the semiconductor die.

27. The electronic device of claim 26, wherein the fifth conductive segment is at least partially encircled by the first, second, third and fourth conductive segments.

28. A method of manufacturing an electronic device, the method comprising:
forming at least two multinode pads on a side of a semiconductor die or wafer, the multinode pad including: a first conductive segment exposed along the side of the semiconductor die, a second conductive segment exposed along the side of the semiconductor die, the second conductive segment spaced from the first conductive segment along the side of the semiconductor die; and
forming a conductive stud bump on a portion of the first conductive segment to a portion of the second conductive segment on a first of the multinode pads and no conductive stud bump connecting a portion of the first conductive segment to a portion of the second conductive segment on a second of the multinode pads.

29. The method of claim 28, wherein forming the multinode pad further comprises forming the second conductive segment of the multinode pad spaced from the first conductive segment of the multinode pad by a gap distance of 1 µm or more and 100 µm or less.

30. The method of claim 28, further comprising:
forming additional multinode pads on the side of the semiconductor die or wafer, each multinode pad including:
a first conductive segment exposed along the side of the semiconductor die, and
a second conductive segment exposed along the side of the semiconductor die, the second conductive segment spaced from the first conductive segment along the side of the semiconductor die; and
selectively forming a conductive stud bump on of the additional plurality of multinode pads, each conductive stud bump formed on a portion of the first conductive segment of the respective multinode pad and on a portion of a second conductive segment of the respective multinode pad.

31. The method of claim 28, further comprising:
forming a supply circuit having an output coupled to the first conductive segment of the first multinode pad; and
forming a programming circuit having an input and an output, the input of the programming circuit coupled to the second conductive segment of the multinode pad, and the output of the programming circuit coupled to a another programmable circuit of the semiconductor die.

32. The method of claim 28, wherein the second conductive segment of the multinode pad is spaced from the first conductive segment of the multinode pad by a gap distance of 1 µm or more and 100 µm or less.

33. The method of claim 32, wherein the gap distance is 10 µm or more and 30 µm or less.

34. The method of claim 32, wherein the gap distance is 50 µm or more and 100 µm or less.

35. The method of claim 32, further comprising:
forming a supply circuit having an output coupled to the first conductive segment of the first multinode pad; and
forming a programming circuit having an input and an output, the input of the programming circuit coupled to the second conductive segment of the multinode pad, and the output of the programming circuit coupled to a another programmable circuit of the semiconductor die.

36. The method of claim 32, further comprising:
forming a load circuit having a power input coupled to the first conductive segment of the first multinode pad; and
forming a supply circuit having an output coupled to the first conductive segment of the multinode pad.

37. The method of claim 36, further comprising an additional multinode pad for coupling the load circuit to the supply circuit.

38. The method of claim 28, further comprising:
forming a load circuit having a power input coupled to the first conductive segment of the first multinode pad; and
forming a supply circuit having an output coupled to the first conductive segment of the multinode pad.

39. The method of claim 38, further comprising:
forming a additional multinode pads, the additional multinode pads each including: a first conductive segment exposed along the side of the semiconductor die and a second conductive segment exposed along the side of the semiconductor die, the second conductive segment of the second multinode pad spaced from the first conductive segment of the multinode pad along the side of the semiconductor die, and the output of the supply circuit coupled to the first conductive segment of the multinode pad; and
forming a programming circuit having an input and an output, the input of the programming circuit coupled to the second conductive segment of the additional multinode pads, and the output of of at least some of the additional multinode pads coupled to a another programmable circuit of the semiconductor die.

40. The method of claim 39, further comprising:
forming a second conductive stud bump connecting a portion of the first conductive segment of the second multinode pad to a portion of the second conductive segment of the second multinode pad.

41. The method of claim 38, further comprising an additional multinode pad for coupling the load circuit to the supply circuit.

42. The method of claim 28, wherein:
forming the multinode pad further comprises forming a third conductive segment exposed along the side of the semiconductor die, the third conductive segment spaced from the first conductive segment along the side of the semiconductor die, and the third conductive segment spaced from the second conductive segment along the side of the semiconductor die; and forming the conductive stud bump further comprises forming the conductive stud bump on a portion of the third conductive segment.

43. The method of claim 42, wherein:
forming the multinode pad further comprises forming a fourth conductive segment exposed along the side of the semiconductor die, the fourth conductive segment spaced from the first conductive segment, the second conductive segment and the third conductive segment along the side of the semiconductor die.

44. The method of claim 43, wherein:
forming the multinode pad further comprises forming a fifth conductive segment exposed along the side of the semiconductor die, the fifth conductive segment spaced from the first conductive segment, the second conductive segment, the third conductive segment and the fourth conductive segment along the side of the semiconductor die.

45. The method of claim 44, wherein the fifth conductive segment is at least partially encircled by the first, second, third and fourth conductive segments.

46. A method of manufacturing an electronic device, the method comprising:
forming at least two multinode pads on a side of a semiconductor die or wafer, each of the multinode pads including: a first conductive segment exposed along the side of the semiconductor die and a second conductive segment exposed along the side of the semiconductor die, the second conductive segment spaced from the first conductive segment along the side of the semiconductor die;
forming a conductive stud bump on a portion of the first and second conductive segments of first of the multinode pads and not forming a conductive stud bump and on a portion of the second conductive segments of a second of the multinode pads; and
performing a wafer probe test that separately engages the first and second conductive segments before forming the conductive stud bump.

47. The method of claim 46, further comprising: performing a wafer probe test that separately engages the first and second conductive segments before forming the conductive stud bump.

* * * * *